United States Patent
Ikenaga et al.

(10) Patent No.: US 8,004,351 B2
(45) Date of Patent: Aug. 23, 2011

(54) SEMICONDUCTOR INTEGRATED CIRCUIT DEVICE AND POWER SUPPLY VOLTAGE CONTROL SYSTEM

(75) Inventors: Yoshifumi Ikenaga, Tokyo (JP); Masahiro Nomura, Tokyo (JP)

(73) Assignee: NEC Corporation, Tokyo (JP)

( * ) Notice: Subject to any disclaimer, the term of this patent is extended or adjusted under 35 U.S.C. 154(b) by 134 days.

(21) Appl. No.: 12/521,605

(22) PCT Filed: Dec. 28, 2007

(86) PCT No.: PCT/JP2007/075245
§ 371 (c)(1),
(2), (4) Date: Jun. 29, 2009

(87) PCT Pub. No.: WO2008/081916
PCT Pub. Date: Oct. 7, 2008

(65) Prior Publication Data
US 2010/0327961 A1    Dec. 30, 2010

(30) Foreign Application Priority Data

Dec. 28, 2006 (JP) ................................ 2006-353621

(51) Int. Cl.
*G05F 1/10* (2006.01)

(52) U.S. Cl. ..................................................... 327/544

(58) Field of Classification Search .................. 327/535, 327/540, 541, 544
See application file for complete search history.

(56) References Cited

U.S. PATENT DOCUMENTS

| 6,943,613 | B2 * | 9/2005 | Miyazaki et al. | 327/534 |
| 7,564,274 | B2 * | 7/2009 | Hughes | 327/108 |
| 7,659,772 | B2 * | 2/2010 | Nomura et al. | 327/544 |

FOREIGN PATENT DOCUMENTS

| JP | 1998111730 A | 4/1998 |
| JP | 2001345693 A | 12/2001 |
| JP | 2002076873 A | 3/2002 |
| JP | 2002100967 A | 4/2002 |
| JP | 2003007838 A | 1/2003 |
| JP | 2003115750 A | 4/2003 |
| JP | 2003142598 A | 5/2003 |
| JP | 2005136956 A | 5/2005 |
| JP | 2005197411 A | 7/2005 |
| JP | 2005328462 A | 11/2005 |
| JP | 2005340426 A | 12/2005 |
| JP | 2006512683 A | 4/2006 |
| JP | 2006332850 A | 12/2006 |
| WO | 99012263 A | 3/1999 |

OTHER PUBLICATIONS

International Search Report for PCT/JP2007/1075245 mailed Mar. 18, 2008.

(Continued)

*Primary Examiner* — Jeffrey S Zweizig

(57) ABSTRACT

A semiconductor integrated circuit device includes: a target circuit whose at least power supply voltage is variable; a power supply voltage providing circuit feeding the target circuit with a power supply voltage; and a minimum energy point monitor circuit detecting an energy-minimizing power supply voltage which minimizes a change in the energy consumed by the target circuit upon a change in the power supply voltage. The power supply voltage delivered by the power supply voltage providing circuit is controlled so as to be equal to the energy-minimizing power supply voltage detected by the minimum energy point monitor circuit.

16 Claims, 10 Drawing Sheets

OTHER PUBLICATIONS

S. Lee, et al., "Run-time Voltage Hopping for Low-power Real-time Systems", Design Automation Conference, p. 806-809, Jun. 5-9, 2000.

D. Blaauw, et al., "Energy Efficient Design for Subthreshold Voltage Operation", IEEE International Symposium on Circuits and Systems, p. 29-32, May 2006.

* cited by examiner

SEMICONDUCTOR INTEGRATED CIRCUIT DEVICE AND POWER SUPPLY VOLTAGE CONTROL SYSTEM

The present application is the National Phase of PCT/JP2007/075245, filed Dec. 28, 2007, which claims priority based on Japanese patent application No. 2006-353621 filed on Dec. 28, 2006, and incorporates the disclosure thereof in its entirety by way of reference herein.

TECHNICAL FIELD

The present invention relates to a semiconductor integrated circuit device, and more particularly to a semiconductor integrated circuit device for performing power supply voltage control for reducing the energy consumed by the semiconductor integrated circuit, and a power supply voltage control system based on such control.

BACKGROUND ART

One of major tasks to be achieved by mobile devices is an increase in the service life of batteries for powering the mobile devices. As one solution of the task, reduction in the energy consumed by the internal circuit of the mobile devices is required. Since the consumed energy is proportional to the electric power consumed by the internal circuit, efforts have been made to research various low-power technologies for reducing the energy consumption. For reducing the power consumed by semiconductor integrated circuits incorporating CMOS logic gates, it is effective to employ a DVFS (Dynamic Voltage and Frequency Scaling) process for controlling the power supply voltage depending on the operating speed required by the circuits. Generally, the power consumed by electronic circuits is monotonously reduced as the power supply voltage is lowered. Based on this general principle, the DVFS process lowers the power supply voltage as much as possible insofar as it can satisfy speed requirements for the circuits for thereby minimizing the electric power consumed by semiconductor integrated circuit devices, as disclosed in Seongsoo Lee and Takayasu Sakurai, "Run-time Voltage Hopping for Low-power Real-time Systems," Design Automation Conference, pp. 806-809, Jun. 5-9, 2000.

Usually, since the consumed energy is lowered as the consumed power is reduced, the energy consumed by a semiconductor integrated circuit device is lowered when the power supply voltage is lowered, as described above. However, when the power supply voltage is lowered, the processing capability of the circuit per unit time is also reduced, and hence a problem arises in that the operating time of the circuit for performing the same process is increased. Inasmuch as the consumed energy is represented by the product of the consumed power and the operating time, the consumed energy may be increased if the rate at which the operating time is increased becomes greater than the rate at which the consumed power is lowered by a reduction in the power supply voltage, as shown in FIG. 1. This tendency manifests itself particularly in a low-voltage range where the rate at which the operating time is increased is high with respect to a reduction in the power supply voltage. FIG. 1 shows an example of the relationship between the power supply voltage and energy consumption of a semiconductor integrated circuit device.

As the dependency of the energy consumed by the semiconductor integrated circuit device upon the power supply voltage has such a tendency, an optimum power supply voltage exists for minimizing the energy consumed by the circuit, as disclosed in David Blaauw and Bo Zhai, "Energy Efficient Design for Subthreshold Voltage Operation," IEEE International Symposium on Circuits and Systems, pp. 21-24, May 2006, for example.

For minimizing the consumed energy by controlling the power supply voltage so as to have an optimum value, the simplest method is to directly measure the energy consumed by the semiconductor integrated circuit device and determine an optimum power supply voltage. According to this method, however, it is necessary to directly measure the energy consumed by the circuit before or while the circuit is operation. In addition, since the optimum voltage varies depending on an environmental factor such as a temperature or the like, it is necessary to re-measure the energy consumed by the circuit each time the environmental factor changes.

Examples of technologies which are relevant to the present invention will be described below.

A technology for determining whether the operating speed of a circuit satisfies a speed requirement or not is disclosed in Japanese Patent Laid-Open Application No. 2002-100967 (JP-A-2002-100967). According to the disclosed technology, a monitor circuit is provided which has power supply voltage vs. delay characteristics equivalent to those of a critical path in a semiconductor integrated circuit device, and the delay characteristics of the monitor circuit are measured to grasp the delay characteristics of the critical path.

It is known that when a semiconductor integrated circuit device is operated under a relatively low power supply voltage, performance variations of the circuitries in the integrated circuit device are increased. Japanese Patent Laid-open Application No. 2003-142598 (JP-A-2003-142598) discloses a technology for compensating for such performance variations. According to the disclosed technology, the difference between the threshold voltages of a PMOS transistor and an NMOS transistor is detected in a semiconductor integrated circuit device having a delay monitor circuit and a main circuit, and a well bias voltage for reducing the difference between the threshold voltages is generated. The generated well bias voltage is applied to the delay monitor circuit and the main circuit.

Detecting a leak current and establishing a source-to-drain voltage to be applied to a MOSFET depending on the detected leak current is disclosed in Japanese Patent Laid-open Application No. 2005-197411 (JP-A-2005-197411), for example.

PCT international publication WO99/12263 discloses that a delay detecting circuit and a substrate bias generating circuit for generating a substrate bias voltage are provided for increasing an operating speed and reducing a leak current in a main circuit, i.e., a target circuit, in a semiconductor integrated circuit device, and the substrate bias voltage is increased or decreased depending on a designed value and a measured delay amount. However, the technology disclosed in WO99/12263 does not control the substrate bias voltage for the purpose of minimizing the consumed energy, i.e., the product of the consumed power and the delay time. Japanese Patent Laid-open Application No. 2003-115750 (JP-A-2003-115750) also discloses a similar semiconductor integrated circuit device configured to equalize the operating speed of a target circuit to a particular reference speed by controlling the power supply voltage. However, the technology disclosed in JP-A-2003-115750 does not control the power supply voltage to minimize the consumed energy.

Japanese Patent Laid-open Application No. 2005-340426 (JP-A-2005-340426) discloses that in order to minimize the power consumption of a target circuit under the condition that the operating speed is constant, a leak current is monitored, and both a power supply voltage and a substrate potential are controlled to keep the ratio of leak power and switching power at a particular value. However, the disclosed technology is problematic in that a complex arrangement is required to control both the power supply voltage and the substrate potential, and the energy consumed by the overall circuit at the time the ratio of leak power and switching power is of a target value cannot be said to be minimum.

SUMMARY OF INVENTION

Technical Problem

As described above, if the power supply voltage of the semiconductor integrated circuit device is controlled to minimize the energy consumption thereof in performing the same process, then according to the method of determining an optimum power supply voltage in advance based on the directly measured the consumed energy, the consumed energy has to be continuously measured because the optimum power supply voltage varies as the environmental factor changes. According to related technologies, in order to minimize the consumed electric power, a leak current or the like is measured and a substrate bias voltage and/or a power supply voltage is varied. However, these technologies are not sufficient to minimize the consumed energy which represents the product of the delay time and the consumed power.

An exemplary object of the present invention is to provide a semiconductor integrated circuit device which will solve the above problems and which does not need to directly measure the energy consumed by a circuit and is capable of controlling a power supply voltage in order to minimize consumed electric power while automatically following changes in an environmental factor.

Another exemplary object of the present invention is to provide a power supply voltage control system for a target circuit, which does not need to directly measure the energy consumed by a circuit and is capable of controlling a power supply voltage in order to minimize consumed electric power while automatically following changes in an environmental factor.

Solution to Problem

According to a first exemplary aspect of the present invention, a semiconductor integrated circuit device includes a target circuit whose at least power supply voltage is variable, a power supply voltage providing circuit feeding the target circuit with a power supply voltage, and a minimum energy point monitor circuit detecting an energy-minimizing power supply voltage which minimizes a change in the energy consumed by the target circuit upon a change in the power supply voltage, wherein the power supply voltage delivered by the power supply voltage providing circuit is controlled so as to be equal to the energy-minimizing power supply voltage detected by the minimum energy point monitor circuit.

According to a second exemplary aspect of the present invention, a semiconductor integrated circuit device includes a target circuit whose at least power supply voltage is variable, a power supply voltage providing circuit feeding said target circuit with a power supply voltage, and a minimum energy point monitor circuit determining whether a rate of change of the energy consumed by the target circuit upon a change in the power supply voltage is positive or negative, wherein the power supply voltage delivered by the power supply voltage providing circuit is controlled so as to be decreased if the value detected by the minimum energy point monitor circuit is positive, and increased if the value detected by the minimum energy point monitor circuit is negative.

According to a third exemplary aspect of the present invention, a power supply voltage control system for a target circuit whose at least power supply voltage is variable, includes power supply voltage providing means for feeding the target circuit with a power supply voltage, and minimum energy point monitor means for detecting an energy-minimizing power supply voltage which minimizes a change in the energy consumed by the target circuit upon a change in the power supply voltage, wherein the power supply voltage providing means is controlled so as to equalize the power supply voltage delivered by the power supply voltage providing means to the energy-minimizing power supply voltage.

According to a fourth exemplary aspect of the present invention, a power supply voltage control system for a target circuit whose at least power supply voltage is variable, includes power supply voltage providing means for feeding the target circuit with a power supply voltage, and minimum energy point monitor means for determining whether a rate of change of the energy consumed by the target circuit upon a change in the power supply voltage is positive or negative, wherein the power supply voltage delivered by the voltage providing means is controlled so as to be decreased if the rate of change is positive, and increased if the rate of change is negative.

According to the present invention, a power supply voltage for minimizing the energy consumed by the target circuit is determined, and the target circuit is energized at this power supply voltage. Consequently, the power supply voltage can be controlled to minimize consumed electric power by automatically following a change in an environmental factor. According to the present invention, in particular, a leak monitor circuit which simulates a leak current of the target circuit and a delay monitor circuit which simulates a critical path delay of the target circuit are employed, and a power supply voltage for minimizing the consumed energy is determined based on the leak current and the critical path delay at the time the actual power supply voltage is applied to these monitor circuits. Therefore, the power supply voltage can be controlled optimally without the need for directly measuring the energy consumed by the target circuit itself.

DESCRIPTION OF REFERENCE SIGNS

1: semiconductor integrated circuit device,
2: minimum energy point monitor circuit,
3, 3A: power supply voltage providing circuit,
4: target circuit,
5: leak blocking circuit,
6: control circuit,
11, 12: delay monitor circuit,
21 to 23: leak monitor circuit,
31, 32: capacitor,
40: comparing circuit,
51 to 54, 55A, 55B, 56A, 56B, 57A, 57B: switch,
61 to 63, 214, 216, 321, 322: node,
81, 82: control signal,
111: critical path replica,
112: XOR gate,
210: current copy circuit,
212, 302A, 302B, 302C: operational amplifier,
213, 215: current mirror,
301, 301A: reference voltage generating circuit,
303A, 303B, 303C: N-MOSFET,
311, 312, . . . , 31S: resistor,
401: differential amplifier,
402: flip-flop
501: RS flip-flop, and
502: P-MOSFET.

DESCRIPTION OF EMBODIMENTS

Preferred exemplary embodiments of the present invention will be described below with reference to the drawings.

First Exemplary Embodiment

A semiconductor integrated circuit device according to a first exemplary embodiment will first be described below.

Figure 1:
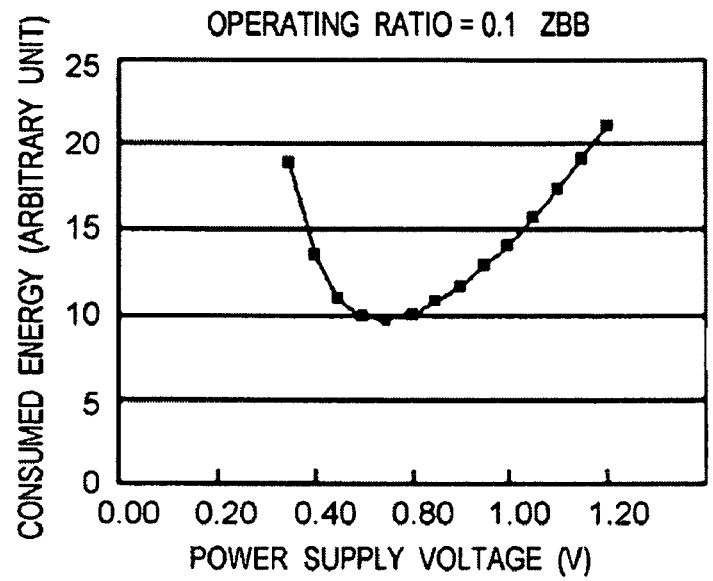
FIG. 1 is a graph showing an example of the dependency of the energy consumed by a semiconductor integrated circuit device upon the power supply voltage.
Figure 2:
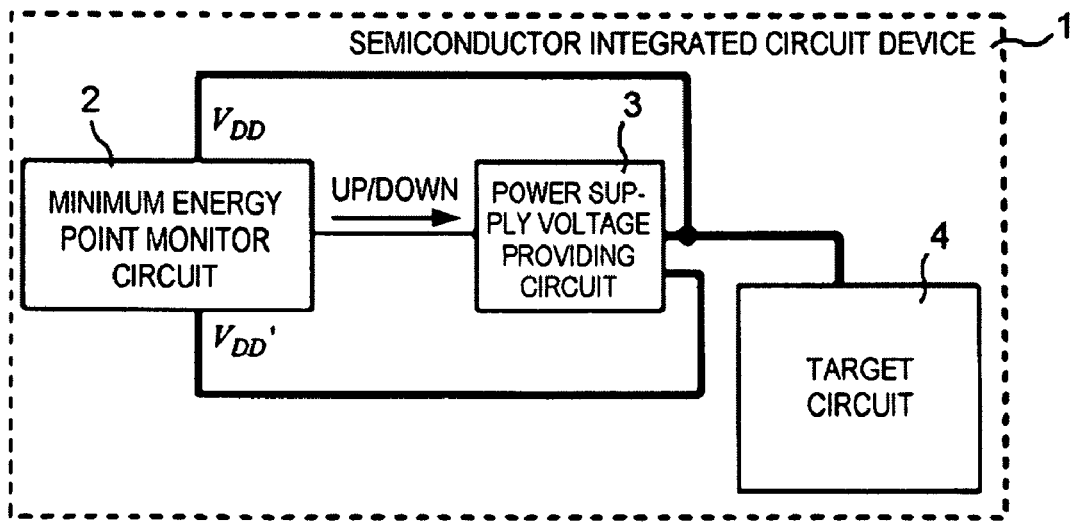
FIG. 2 is a block diagram showing the overall arrangement of a semiconductor integrated circuit device according to a first exemplary embodiment of the present invention.

FIG. 2 shows the overall arrangement of a semiconductor integrated circuit device according to a first exemplary embodiment of the present invention. Semiconductor integrated circuit device 1 includes: target circuit 4 which realizes the primary functions of semiconductor integrated circuit device 1 and performs a process to be performed by semiconductor integrated circuit device 1; minimum energy point monitor circuit 2 which detects a power supply voltage at which the energy consumed by target circuit 4 is minimum, and power supply voltage providing circuit 3 which generates power supply voltage $V_{DD}$ to be supplied to target circuit 4.

Target circuit 4 is a circuit whose power supply voltage is to be controlled. Power supply voltage providing circuit 3 also generates voltage $V_{DD}'$ which is lower than power supply voltage $V_{DD}$ by $\Delta V$. Voltages $V_{DD}$, $V_{DD}'$ are also applied to minimum energy point monitor circuit 2. Minimum energy point monitor circuit 2 feeds signal UP/DOWN for increasing (UP) or lowering (DOWN) power supply voltage $V_{DD}$ with power supply voltage providing circuit 3.

Figure 3:
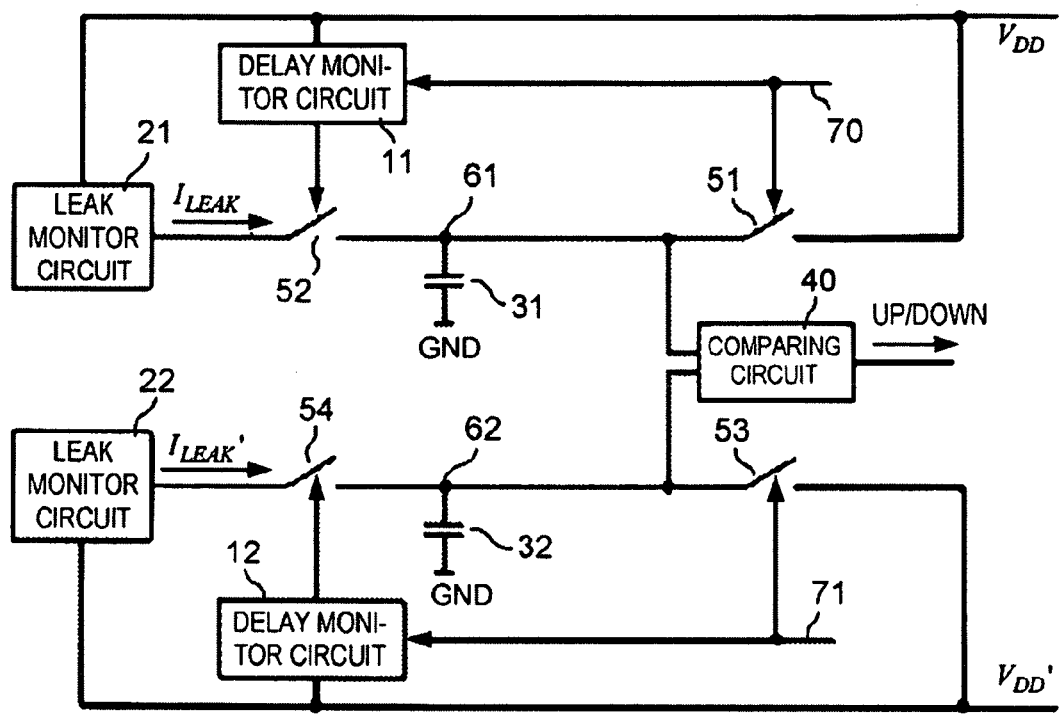
FIG. 3 is a block diagram showing the arrangement of a minimum energy point monitor circuit in the first exemplary embodiment.

FIG. 3 shows the arrangement of minimum energy point monitor circuit 2. Minimum energy point monitor circuit 2 includes: delay monitor circuits 11, 12 which monitor a critical path delay of target circuit 4; leak monitor circuits 21, 22 which monitor a leak current of target circuit 4; capacitors 31, 32; comparing circuit 40; and switches 51 to 54. Switch 51 and switch 52 are connected in series to each other through a mutual junction as node 61, and capacitor 31 is connected between node 61 and ground GND. Similarly, switch 53 and switch 54 are connected in series to each other through a mutual junction as node 62, and capacitor 32 is connected between node 62 and ground GND. Power supply voltage $V_{DD}$ is delivered to delay monitor circuit 11 and leak monitor circuit 21, and is also applied to node 61 via switch 51. Leak current $I_{LEAK}$ detected by leak monitor circuit 21 is supplied to node 61 via switch 52. Switch 51 is controlled by control signal 70, which is also supplied to delay monitor circuit 11. Switch 52 is controlled by an output of delay monitor circuit 11. Similarly, voltage $V_{DD}'$ is supplied to delay monitor circuit 12 and leak monitor circuit 22, and is also applied to node 62 via switch 53. Leak current $I_{LEAK}'$ detected by leak monitor circuit 22 is supplied to node 62 via switch 54. Switch 53 is controlled by control signal 71, which is also supplied to delay monitor circuit 12. Switch 54 is controlled by an output of delay monitor circuit 12. Comparing circuit 40 compares voltage $V_{61}$ at node 61 and voltage $V_{62}$ at node 62 to each other, and delivers signal UP/DOWN based on the result of the comparison. Capacitors 31, 32 have capacitance value $\alpha C_0$ which is represented by the product of switching capacitance $C_0$ of target circuit 4 and operating ratio $\alpha$.

Figure 4:
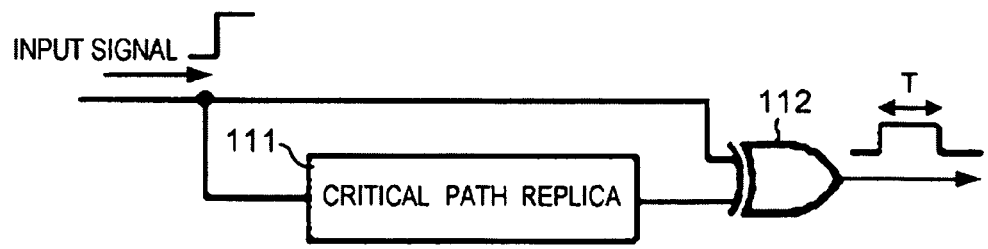
FIG. 4 is a circuit diagram showing the arrangement of a delay monitor circuit in the first exemplary embodiment.

FIG. 4 shows the arrangement of delay monitor circuit 11. Delay monitor circuit 11 includes: critical path replica 111 of target circuit 4; and XOR (exclusive-OR) gate 112. Critical path replica 111, which is formed according to the same semiconductor device fabrication process as the process for forming target circuit 4, is a circuit which gives an input signal a delay which is equal to a critical path delay of target circuit 4. Voltage $V_{DD}$ that is equal to the power supply voltage of target circuit 4 is applied to critical path replica 111. XOR gate 112 is fed with the input signal and an output signal from critical path replica 111, and delivers a pulse signal having a pulse duration which is equal to the critical path delay of target circuit 4 based on the input signal. Delay monitor circuit 12 is identical in circuit arrangement to delay monitor circuit 11, but is different from delay monitor circuit 11 in that the voltage applied to the critical path replica of delay monitor circuit 12 is $V_{DD}'$ which is lower than $V_{DD}$ by $\Delta V$.

Figure 5:
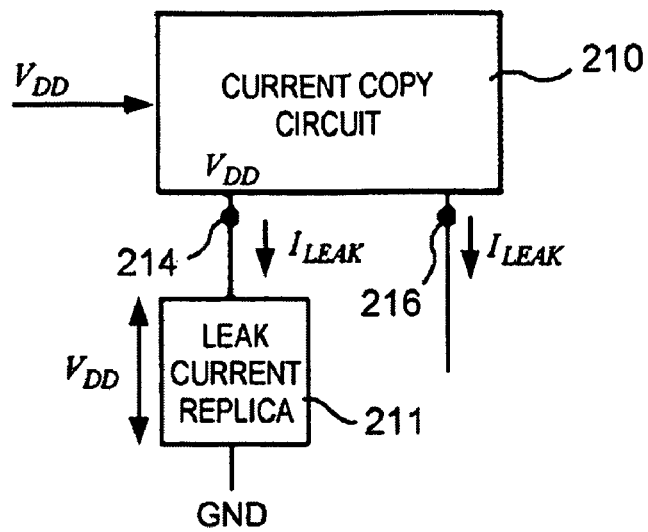
FIG. 5 is a circuit diagram showing the arrangement of a leak monitor circuit in the first exemplary embodiment.

FIG. 5 shows the arrangement of leak monitor circuit 21. Leak monitor circuit 21 includes: leak current replica 211 of target circuit 4; and current copy circuit 210. Current copy circuit 210 delivers respective currents to two nodes 214, 216, and has a function to keep the potential at node 214 as a potential equal to a reference voltage supplied from an external source and also to keep the current flowing from node 216 as a current equal to a current flowing through node 214. Here, the reference voltage is equal to power supply voltage $V_{DD}$ of target circuit 4. Leak current replica 211, which is formed according to the same semiconductor device fabrication process as the process for forming target circuit 4, serves to reproduce leak current $I_{LEAK}$ in target circuit 4. Therefore, leak current replica 211 is connected to node 214, and is applied with voltage $V_{DD}$ that is equal to the power supply voltage of target circuit 4. As a result, leak monitor circuit 21 serves as a current source for causing a current that is equal to leak current $I_{LEAK}$ of target circuit 4 to flow from node 216. Leak monitor circuit 22 is identical in circuit arrangement to leak monitor circuit 21, but is different from leak monitor circuit 21 in that the voltage applied to the leak current replica thereof is $V_{DD}'$ which is lower than $V_{DD}$ by $\Delta V$.

Figure 6:
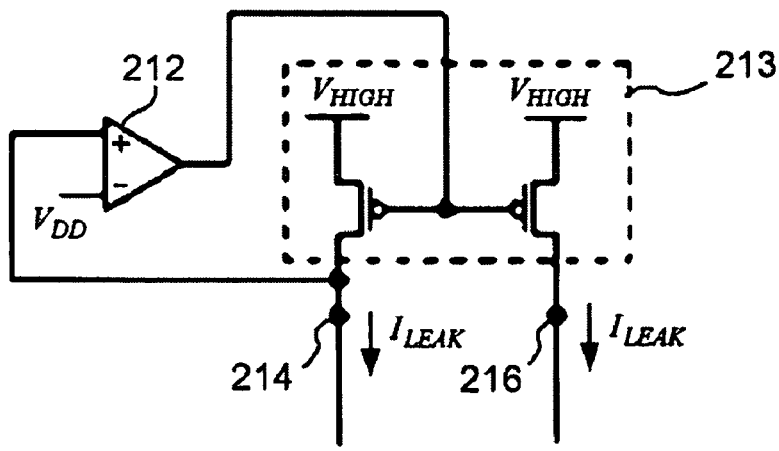
FIG. 6 is a circuit diagram showing the arrangement of a current copy circuit in the first exemplary embodiment.

FIG. 6 shows the arrangement of current copy circuit 210 disposed in each of leak monitor circuits 21, 22. Current copy circuit 210 comprises operational amplifier (OP amp) 212 and current mirror 213. Operational amplifier 212 has an inverting input terminal for being fed with voltage $V_{DD}$ (or $V_{DD}'$) and a non-inverting input terminal connected to node 215. The output of operational amplifier 212 is supplied to the gates of both transistors of current mirror 213. These transistors have respective drains fed with voltage $V_{HIGH}$ and respective sources connected to nodes 214, 216, respectively. Voltage $V_{HIGH}$ is a voltage that is generated by a voltage booster, not shown, in the semiconductor integrated circuit device, and is higher than power supply voltage $V_{DD}$. Such current copy circuit 210 keeps node 214 at potential $V_{DD}$ with a feedback loop comprising operational amplifier 212 and current mirror 213, and delivers, from node 216, a current equal to current $I_{LEAK}$ flowing through node 214.

Figure 7:
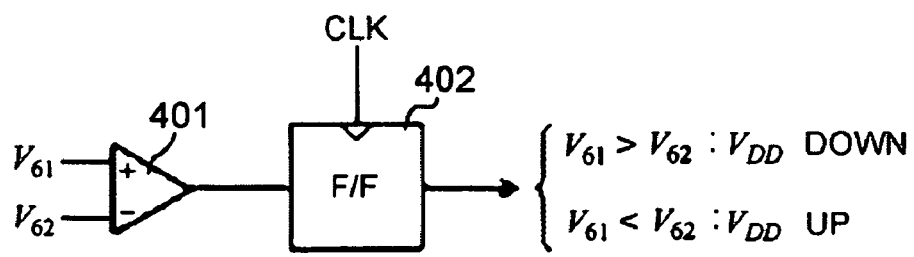
FIG. 7 is a circuit diagram showing the arrangement of a comparing circuit in the first exemplary embodiment.

FIG. 7 shows the circuit arrangement of comparing circuit 40. Comparing circuit 40 comprises differential amplifier 401 and flip-flop 402 for being fed with an output of differential amplifier 401 as data. The differential amplifier has a non-inverting input terminal for being fed with potential $V_{61}$ at node 61 and an inverting input terminal for being fed with potential $V_{62}$ at node 62. Flip-flop 402 is also fed with clock signal CLK. In comparing circuit 40, flip-flop 401 receives the result of a comparison between $V_{61}$ and $V_{62}$, and delivers the comparison result as control signal UP/DOWN to power supply voltage providing circuit 3.

The operating principles of minimum energy point monitor circuit 2 will be described below. Energy $E_{ALL}$ which is consumed by a certain circuit when it performs a process of certain computational amount is represented by the sum of switching energy $E_{SW}$ and leak energy $E_{LEAK}$, and expressed by equation (1):

$$E_{ALL} = E_{SW} + E_{LEAK} = \frac{1}{2}\alpha C_0 V_{DD}^2 N + N T I_{LEAK} V_{DD} \quad (1)$$

where N represents the number of clock cycles required for computations, and depends on the computational amount, T represents a clock period and depends on the critical path delay of target circuit 4, $V_{DD}$ represents the power supply voltage of target circuit 4, $C_0$ represents the switching capacity of target circuit 4, and $I_{LEAK}$ represents the leak current of target circuit 4. At a global minimum point of consumed energy $E_{ALL}$, e.g., at a minimal point ($E_{ALL}=E_{MIN}$), $dE_{ALL}/dV_{DD}=0$. Therefore, the following equation (2) is satisfied:

$$\frac{dE_{ALL}}{dV_{DD}}\bigg|_{E_{ALL}=E_{MIN}} = N\left(\alpha C_0 V_{DD} + T I_{LEAK} + \frac{I'_{LEAK}T' - I_{LEAK}T}{V_{DD}' - V_{DD}} \cdot V_{DD}\right) = 0 \quad (2)$$

where $V_{DD}'=V_{DD}-\Delta V$, $\Delta V$ being assumed to be sufficiently smaller than $V_{DD}$. By multiplying the entire equation (2) by $(V_{DD}'-V_{DD})/\alpha C_0 V_{DD}$ and using the approximation of $V_{DD}'/V_{DD} \approx 1$, the following equation (3) is obtained:

$$V_{DD}' + \frac{I'_{LEAK}T'}{\alpha C_0} = V_{DD} + \frac{I_{LEAK}T}{\alpha C_0} \quad (3)$$

The second term on the left side of equation (3) represents a potential quantity which increases when a capacitor having capacitance value $\alpha C_0$ is charged with current value $I_{LEAK}'$ for time period T', and the second term on the right side thereof represents a potential quantity which increases when the capacitor having capacitance value $\alpha C_0$ is charged with current value $I_{LEAK}$ for time period T. Therefore, the left side of equation (3) represents the potential of the capacitor having capacitance value $\alpha C_0$ when the capacitor has been charged to potential $V_{DD}'$ and thereafter the capacitor is charged with leak current $I_{LEAK}'$ at power supply voltage $V_{DD}'$ for delay time T (clock period) T. The right side of equation (3) represents the potential of the capacitor having capacitance value $\alpha C_0$ when the capacitor has been charged to potential $V_{DD}$ and thereafter the capacitor is charged with leak current $I_{LEAK}$ at power supply voltage $V_{DD}$ for delay time (clock period) T. If the potential represented by the right side is higher than the potential represented by the left side, then since $dE_{ALL}/dV_{DD}>0$, the power supply voltage is lowered, and if the potential represented by the right side is lower than the potential represented by the left side, then since $dE_{ALL}/dV_{DD}<0$, the power supply voltage is increased, for thereby finally controlling the power supply voltage so as to be equal to a power supply potential which satisfies equation (3).

Figure 8:
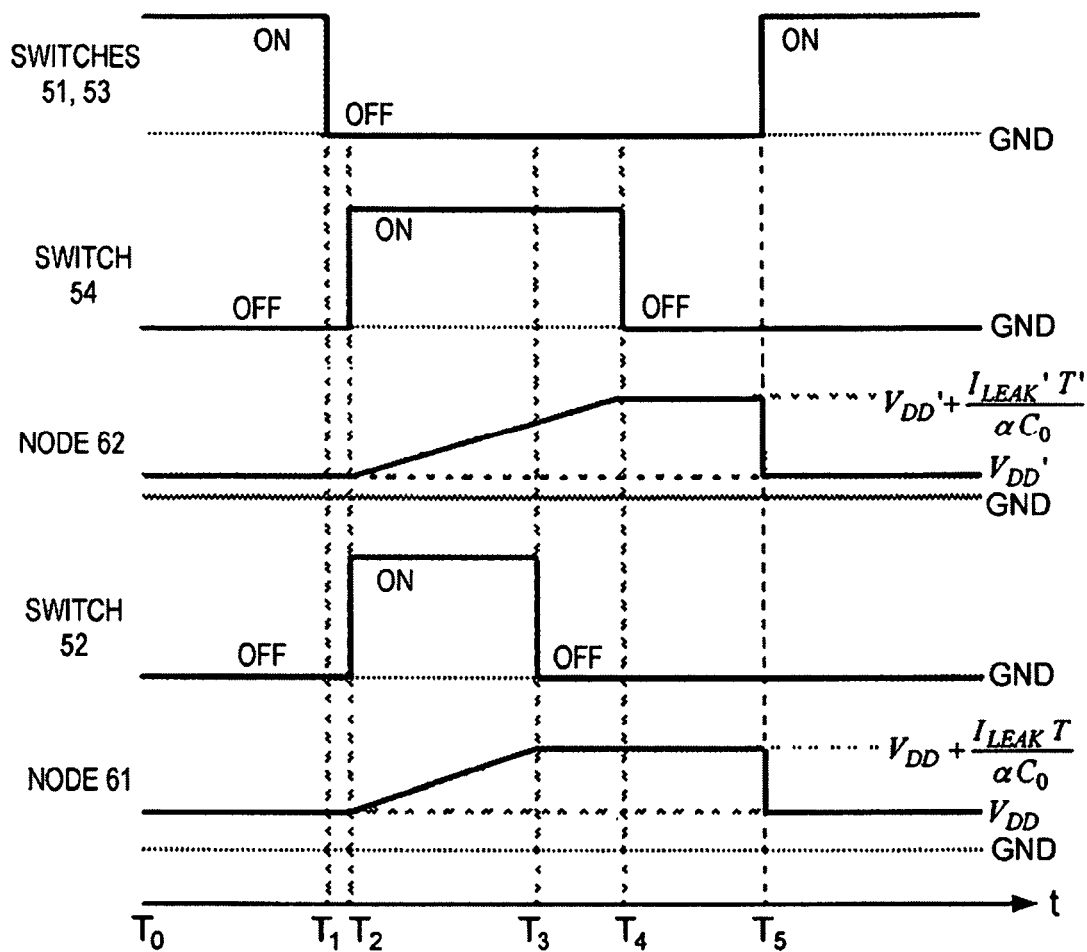
FIG. 8 is a timing chart showing the operation of the minimum energy point monitor circuit in the first exemplary embodiment.

A process for realizing the control based on the above operating principles with a circuit will be described below. FIG. 8 is a timing chart showing circuit operation, with the horizontal axis representing time t.

Firstly, in the circuit shown in FIG. 3, switches 51, 53 are turned on, i.e., are rendered conductive, and switches 52, 54 are turned off, i.e., are rendered non-conductive, bringing the potential at node 61 to $V_{DD}$ and bringing the potential at node 62 to $V_{DD}'$. This state is indicated by the period $T_0<t<T_1$ in FIG. 8.

Then, when switches 51, 53 are turned off at time $t=T_1$, and switches 52, 54 are turned on at time $t=T_2$, capacitor 31 is charged with current $I_{LEAK}$, and capacitor 32 is charged with current $I_{LEAK}'$. Charging times T ($=T_3-T_2$), T' ($=T_4-T_2$) of capacitors 31, 32 are controlled respectively by outputs from delay monitor circuits 11, 12. Stated otherwise, switch 52 remains turned on for a period which is as long as critical delay time T detected by delay monitor circuit 11, and switch 54 remains turned on for a period which is as long as critical delay time T' detected by delay monitor circuit 12. After the completion of the charging of the capacitors (t=T₄), their potentials V₆₁, V₆₂ are expressed respectively by:

$$V_{61} = V_{DD} + \frac{I_{LEAK}T}{\alpha C_0} \quad (4)$$

$$V_{62} = V_{DD}' + \frac{I_{LEAK}'T'}{\alpha C_0} \quad (5)$$

Then, in comparing circuit 40, the result of the comparison between potential V₆₁ and potential V₆₂ is read into the flip-flop. Comparing circuit 40 sends control signal UP/DOWN to power supply voltage providing circuit 3 for lowering the power supply voltage if V₆₁>V₆₂ and increasing the power supply voltage if V₆₁<V₆₂. After the output signal from comparing circuit 40 is finalized (t=T₅), switches 51, 53 are turned on to initialize potential V₆₁ and potential V₆₂ again. Then, the same operation will be repeated.

Figure 9:
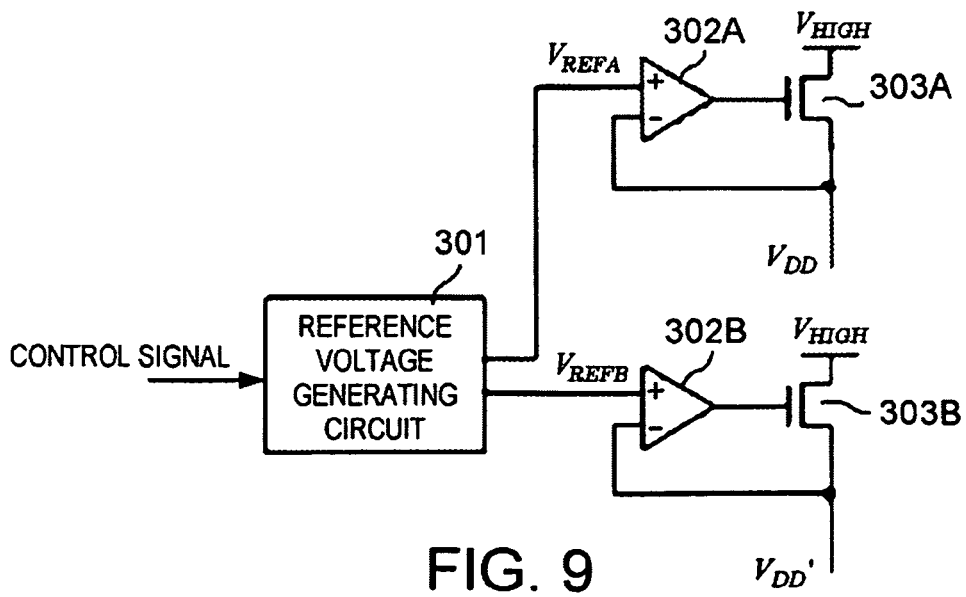
FIG. 9 is a circuit diagram showing the arrangement of a power supply voltage providing circuit in the first exemplary embodiment.

FIG. 9 shows the circuit arrangement of power supply voltage providing circuit 3. Power supply voltage providing circuit 3 includes reference voltage generating circuit 301, operational amplifiers 302A, 302B, and N-MOSFETs (N-channel MOS field-effect transistors) 303A, 303B. N-MOSFETs 303A, 303B have respective drains connected to power supply $N_{HIGH}$. Operational amplifiers 302A, 302B have respective non-inverting input terminals for being fed with outputs $V_{REFA}$, $V_{REFB}$ from reference voltage generating circuit 301 and respective inverting input terminals connected to the respective sources of N-MOSFETs 303A, 303B. The outputs of operational amplifiers 302A, 302B are connected respectively to the gates of N-MOSFETs 303A, 303B. With this arrangement, N-MOSFETs 303A, 303B function as control elements of a series regulator, and the sources of N-MOSFETs 303A, 303B deliver respective potentials $V_{DD}$ (=$V_{REFA}$), $V_{DD}'$ (=$V_{REFB}$) to the outside.

Figure 10:
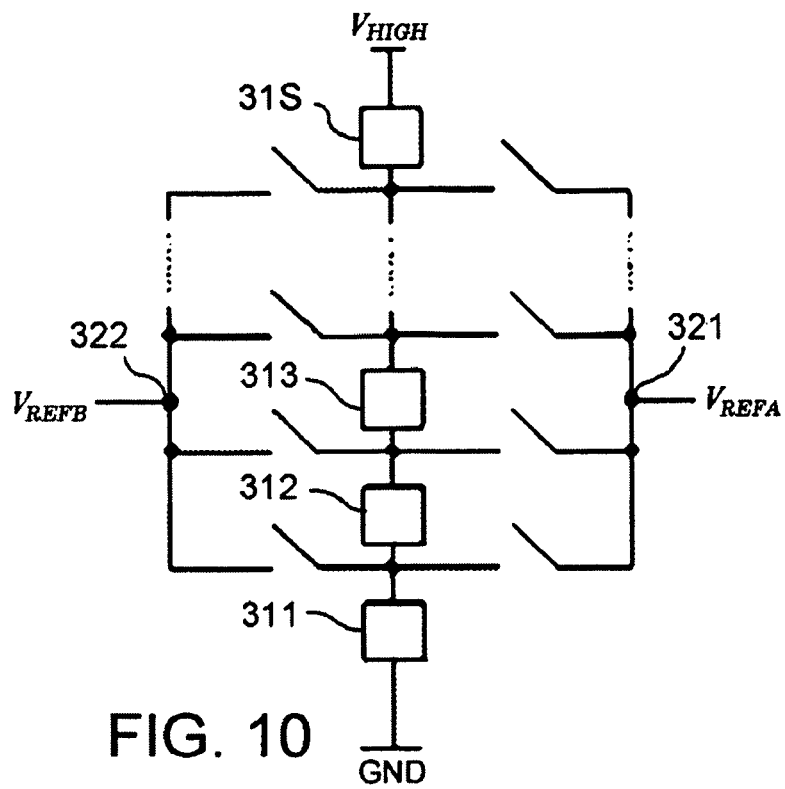
FIG. 10 is a circuit diagram showing the arrangement of a reference voltage generating circuit in the first exemplary embodiment.

FIG. 10 shows the circuit arrangement of reference voltage generating circuit 301. Reference voltage generating circuit 301 includes: S pieces of resistors 311, 312, . . . , 31S connected in series between power supply $N_{HIGH}$ and ground GND; two output nodes 321, 322; (S−1) pieces of switches inserted between nodes between adjacent ones of the resistors and output node 321; and (S−1) pieces of switches inserted between the nodes between the adjacent ones of the resistors and other output node 322. Only one of the (S−1) pieces of switches connected to output node 321 is turned on, delivering potential $V_{REFA}$ of the corresponding node from output node 321. Similarly, only one of the (S−1) pieces of switches connected to output node 322 is turned on, delivering potential $V_{REFB}$ of the corresponding node from output node 322. In this case, $V_{REFB}=V_{REFA}-\Delta V$ where $\Delta V$ is of a value sufficiently smaller than $V_{REFA}$, $V_{REFB}$. The position where a switch is to be turned on is controlled by the output from minimum energy point monitor circuit 2.

As described above, the semiconductor integrated circuit device according to the present exemplary embodiment is capable of controlling the power supply voltage such that it is decreased if the differential value of the energy consumed by target circuit 4 at the present power supply voltage is positive, and it is increased if the differential value is negative, for finally controlling the power supply voltage for minimizing the energy consumed by target circuit 4.

In the present exemplary embodiment, a series regulator is used as the regulator constituting power supply voltage providing circuit 3. However, a regulator circuit of any type insofar as it is capable of controlling its output voltage, e.g., a switching regulator, may be used.

In the present exemplary embodiment, delay monitor circuit 11 detects critical path delay T, leak monitor circuit 21 detects leak current $I_{LEAK}$, and capacitor 31 having capacitance value $\alpha C_0$ is used as a switching power monitor. If pulse duration T₂ of the output pulses from the delay monitor circuit, current value I₂ flowing from the leak monitor circuit, and capacitance value C₂ of the capacitor satisfy equation (6) regardless of the power supply voltage, then those values (T₂, I₂, C₂) may not be in agreement with T, $I_{LEAK}$, $\alpha C_0$.

$$\frac{I_2 T_2}{C_2} = \frac{I_{LEAK} T}{\alpha C_0} \quad (6)$$

Second Exemplary Embodiment

Figure 11:
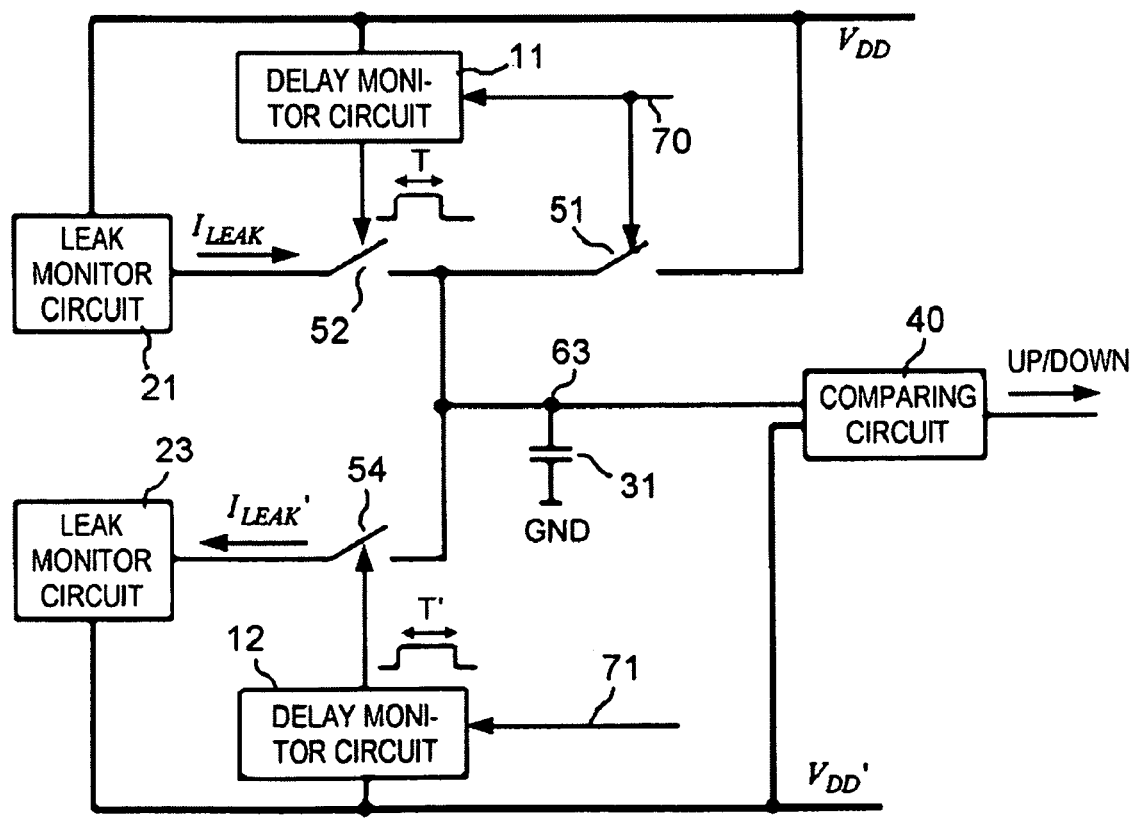
FIG. 11 is a block diagram showing the arrangement of a minimum energy point monitor circuit of a semiconductor integrated circuit device according to a second exemplary embodiment of the present invention.

A semiconductor integrated circuit device according to a second exemplary embodiment of the present invention will be described below. The semiconductor integrated circuit device of the second exemplary embodiment has an overall arrangement which is similar to the semiconductor integrated circuit device of the first exemplary embodiment shown in FIG. 2, and is different therefrom only as to the circuit arrangement of minimum energy point monitor circuit 2. Therefore, minimum energy point monitor circuit 2 in the second exemplary embodiment will be described below. FIG. 11 shows the circuit arrangement of minimum energy point monitor circuit 2 in the second exemplary embodiment.

Minimum energy point monitor circuit 2 in the second exemplary embodiment includes: delay monitor circuits 11, 12 which monitor a critical path delay of target circuit 4; leak monitor circuits 21, 23 which monitor a leak current of target circuit 4; capacitor 31; comparing circuit 40; and switches 51, 52, 54. Switch 51 and switch 52 are connected in series to each other through a mutual junction connected to node 63, and capacitor 31 is connected between node 63 and ground GND. Power supply voltage $V_{DD}$ is supplied to delay monitor circuit 11 and leak monitor circuit 21, and is also applied to node 63 via switch 51. Leak current $I_{LEAK}$ detected by leak monitor circuit 21 is supplied to node 63 via switch 52. Switch 51 is controlled by control signal 70, which is also supplied to delay monitor circuit 11. Switch 52 is controlled by the output of delay monitor circuit 11. Voltage $V_{DD}'$ is supplied to delay monitor circuit 12, leak monitor circuit 22, and comparing circuit 40. Leak current $I_{LEAK}'$ detected by leak monitor circuit 22 is supplied to node 63 via switch 54. Control signal 71 is supplied to delay monitor circuit 12. Switch 54 is controlled by the output of delay monitor circuit 12. Comparing circuit 40 compares voltage V₆₃ at node 63 and voltage $V_{DD}'$, and delivers signal UP/DOWN based on the result of the comparison. Capacitor 31 has a capacitance value a C₀ which is represented by the product of switching capacitance C₀ of target circuit 4 and operating ratio α.

According to the second exemplary embodiment, delay monitor circuits 11, 12 have a circuit arrangement which is the same as that in the first exemplary embodiment shown in FIG. 4, and leak monitor circuit 21 has a circuit arrangement which is the same as that in the first exemplary embodiment shown in FIG. 5. Timings for controlling switches 51, 52, 54 are also the same as those in the first exemplary embodiment.

Figure 12:
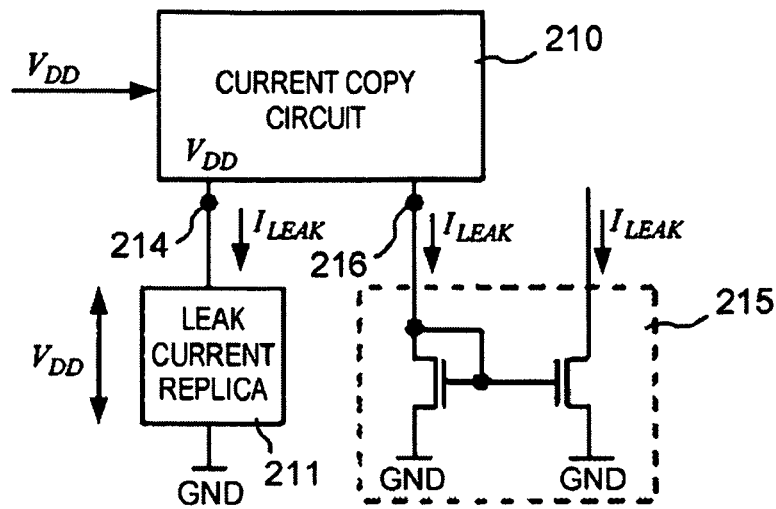
FIG. 12 is a circuit diagram showing the arrangement of a leak monitor circuit in the second exemplary embodiment.

FIG. 12 shows the arrangement of leak monitor circuit 23 in the second exemplary embodiment. Leak monitor circuit 23 is similar to the leak monitor circuit shown in FIG. 5 except that current mirror 215 connected to node 216 is added thereto, and is configured to pull electric charges from a point to which the circuit is connected, rather introducing electric charges into the point to which the circuit is connected. Specifically, current mirror 215 comprises two transistors whose sources are connected to ground. One of the transistors has a drain connected to node 216 and the other transistor has a drain which draws a current corresponding to leak current $I_{LEAK}'$. With minimum energy point monitor circuit 2 employing this leak monitor circuit 23, electric charges are discharged from capacitor 32 when switch 54 is turned on.

Figure 13:
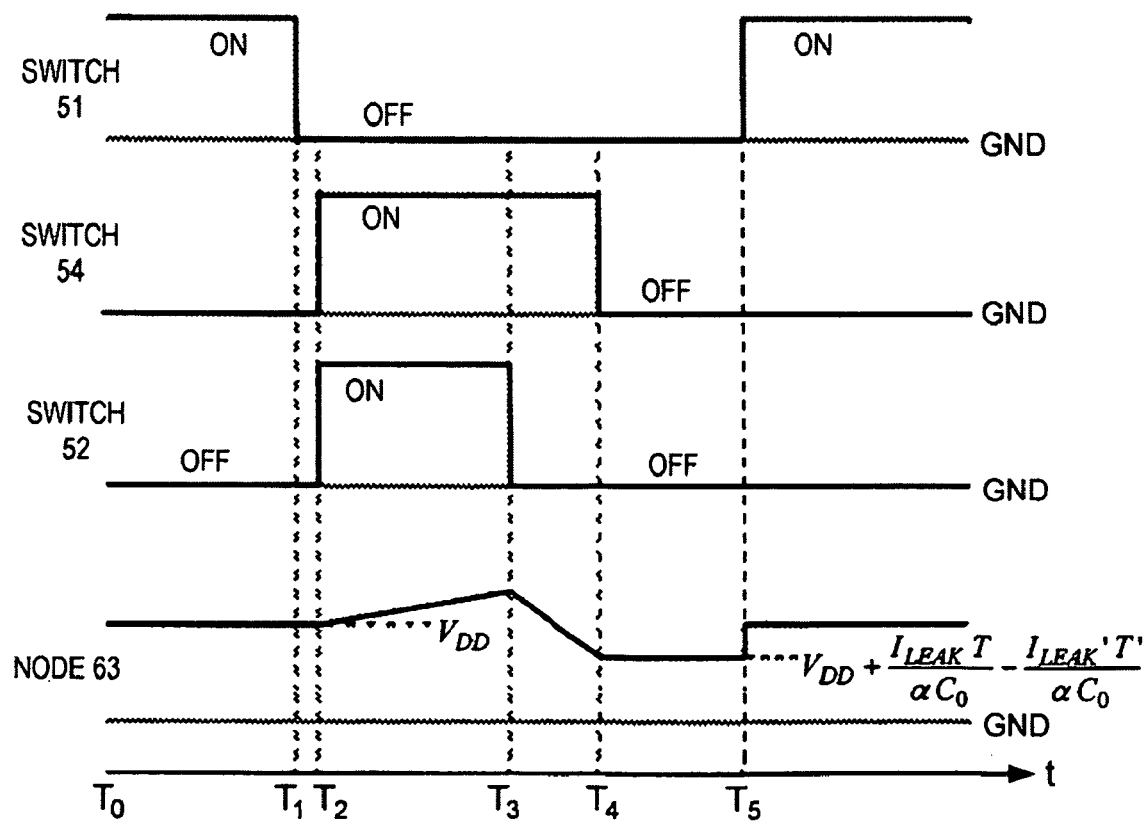
FIG. 13 is a timing chart showing the operation of the minimum energy point monitor circuit in the second exemplary embodiment.

FIG. 13 shows the circuit operation of minimum energy point monitor circuit 2 of the second exemplary embodiment. After the capacitor is charged and discharged ($t=T_4$), potential $V_{63}$ of node 63 is expressed by:

$$V_{63} = V_{DD} + \frac{I_{LEAK}T}{\alpha C_0} - \frac{I'_{LEAK}T'}{\alpha C_0} \quad (7)$$

Since comparing circuit 40 compares $V_{63}$ and $V_{DD}'$ and delivers control signal UP/DOWN for decreasing the power supply voltage if $V_{63}>V_{DD}'$ and increasing the power supply voltage if $V_{63}<V_{DD}'$, the power supply voltage of target circuit 4 is controlled so as to be equal to power supply voltage $V_{DD}$ which satisfies equation (8):

$$V'_{DD} = V_{DD} + \frac{I_{LEAK}T}{\alpha C_0} - \frac{I'_{LEAK}T'}{\alpha C_0} \quad (8)$$

Equation (8) is equivalent to equation (3). Consequently, it can be seen that the power supply voltage is controlled so as to be equal to a power supply voltage for minimizing the consumed energy.

As described above, the semiconductor integrated circuit device of the second exemplary embodiment is capable of controlling the power supply voltage delivered to target circuit 4 such that it is finally equalized to the power supply voltage for minimizing the consumed energy. Furthermore, inasmuch as the semiconductor integrated circuit device of the second exemplary embodiment generates control signal UP/DOWN for power supply voltage $V_{DD}$ based on only the magnitude relationship between the value of potential $V_{63}$ of node 63 and the value of voltage $V_{DD}'$, comparing circuit 40 may have its accuracy guaranteed in the vicinity of $V_{DD}'$, i.e., only in the output potential range of power supply voltage providing circuit 3. According to the present exemplary embodiment, furthermore, as only one capacitor is required, the area overhead in the semiconductor integrated circuit device can be reduced.

Third Exemplary Embodiment

Figure 14:
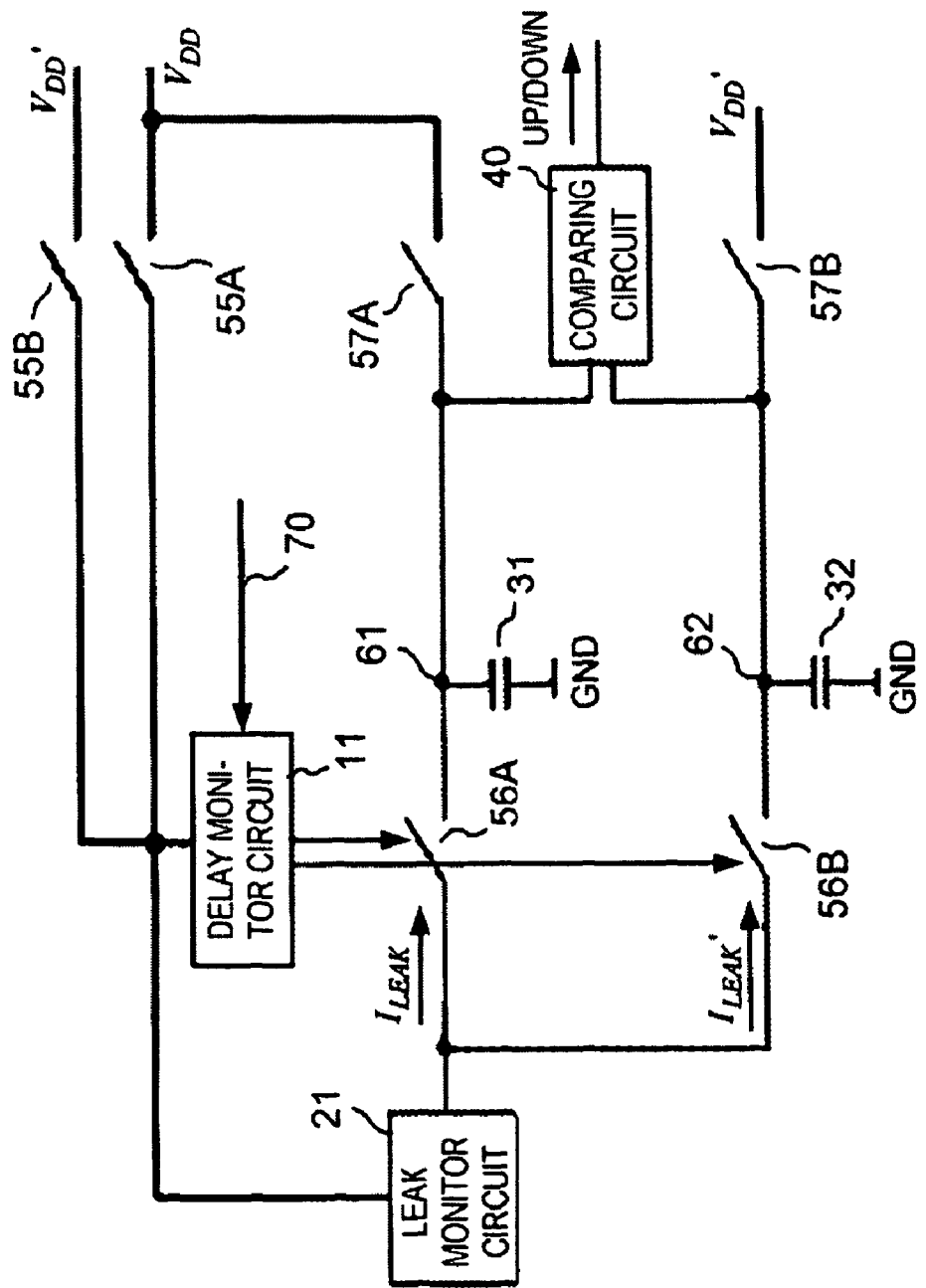
FIG. 14 is a block diagram showing the arrangement of a minimum energy point monitor circuit of a semiconductor integrated circuit device according to a third exemplary embodiment of the present invention.

A semiconductor integrated circuit device according to a third exemplary embodiment of the present invention will be described below. The semiconductor integrated circuit device of the third exemplary embodiment has an overall arrangement which is similar to the semiconductor integrated circuit device of the first exemplary embodiment shown in FIG. 2, and is different therefrom only as to the circuit arrangement of minimum energy point monitor circuit 2. Therefore, minimum energy point monitor circuit 2 in the third exemplary embodiment will be described below. FIG. 14 shows the circuit arrangement of minimum energy point monitor circuit 2 in the third exemplary embodiment.

Minimum energy point monitor circuit 2 in the third exemplary embodiment includes: delay monitor circuit 11 which monitors a critical path delay of target circuit 4; leak monitor circuit 21 which monitors a leak current of target circuit 4; capacitors 31, 32; comparing circuit 40; and switches 55A, 55B, 56A, 56B, 57A, 57B. Node 61 is connected to the output of leak monitor circuit 21 through switch 56A, and is fed with power supply voltage $V_{DD}$ via switch 57A. Capacitor 31 is connected between node 61 and ground GND. Node 62 is connected to the output of leak monitor circuit 21 through switch 56B, and is fed with voltage $V_{DD}'$ via switch 57B. Capacitor 32 is connected between node 62 and ground GND. Delay monitor circuit 11 and leak monitor circuit 21 are fed with power supply voltage $V_{DD}$ via switch 55A, and are fed with voltage $V_{DD}'$ via switch 55B. Control signal 70 is supplied to delay monitor circuit 11, whose output controls switches 56A, 56B. Comparing circuit 40 compares voltage $V_{61}$ at node 61 and voltage $V_{62}$ at node 62, and delivers signal UP/DOWN based on the result of the comparison. Capacitors 31, 32 have capacitance value $\alpha C_0$ which is represented by the product of switching capacitance $C_0$ of target circuit 4 and operating ratio $\alpha$.

In the third exemplary embodiment, delay monitor circuit 11 has a circuit arrangement which is the same as the circuit arrangement in the first exemplary embodiment shown in FIG. 4, and leak monitor circuit 21 has a circuit arrangement which is the same as the circuit arrangement in the first exemplary embodiment shown in FIG. 5.

Figure 15:
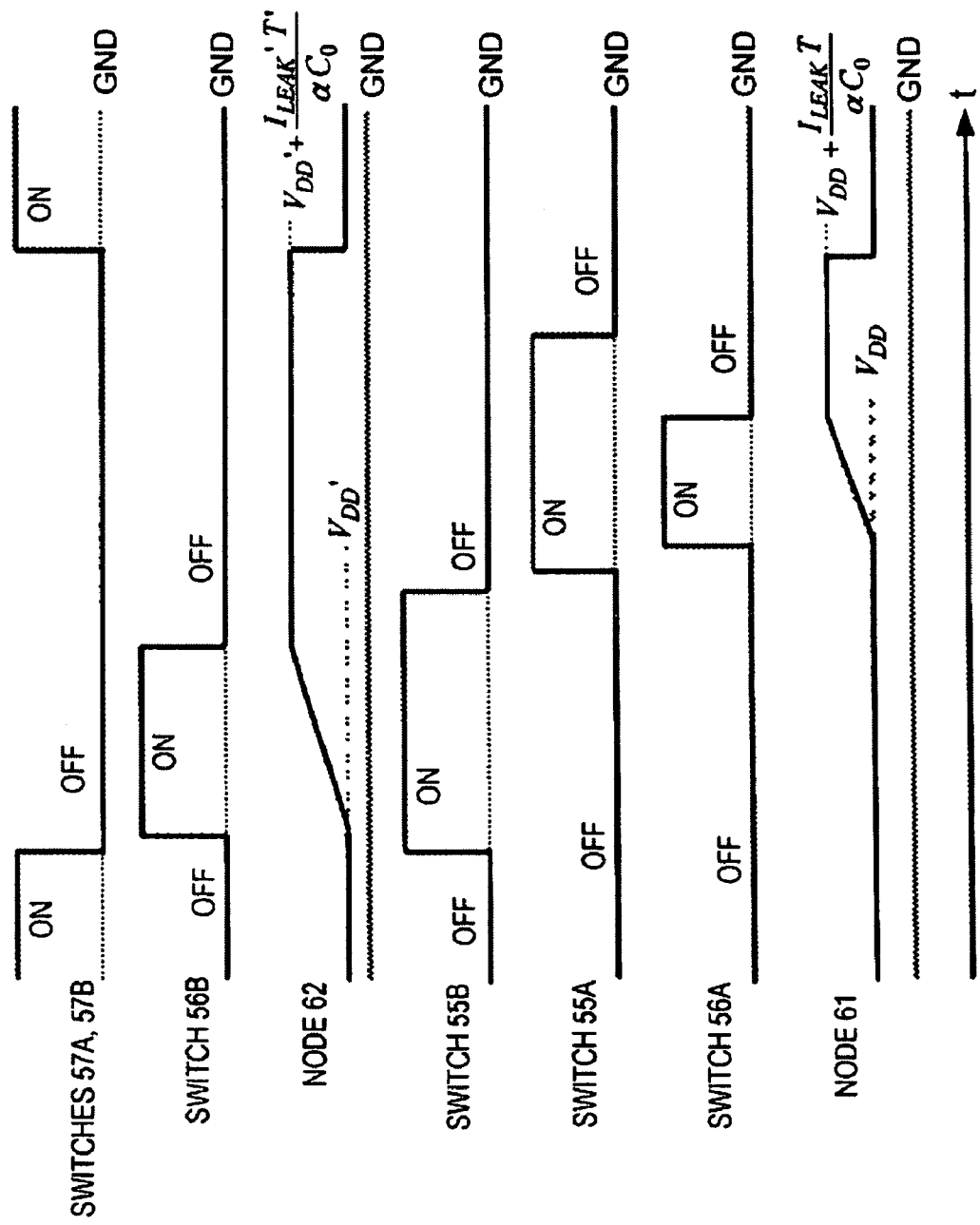
FIG. 15 is a timing chart showing the operation of the minimum energy point monitor circuit in the third exemplary embodiment.

FIG. 15 shows the circuit operation of minimum energy point monitor circuit 2 in the third exemplary embodiment.

In an initial state, switches 55A, 55B, 56A, 56B are turned off, and switches 57A, 57B are turned on, placing node 61 at potential $V_{DD}$ and node 62 at potential $V_{DD}'$. Thereafter, switches 57A, 57B are turned off, and switch 55 6 is turned on, applying power supply voltage $V_{DD}'$ to delay monitor circuit 11 and leak monitor circuit 21. Then, switch 56B is turned on to charge capacitor 32 with current $I_{LEAK}'$. The charging time of capacitor 32 is controlled by the output of delay monitor circuit 11, and is represented by T'. After capacitor 32 is charged, switch 56B is turned off, holding the potential of capacitor 32. Then, switch 55A is turned on, applying power supply voltage $V_{DD}$ to delay monitor circuit 11 and leak monitor circuit 21. Then, switch 56A is turned on to charge capacitor 31 with current $I_{LEAK}$. The charging time of capacitor 31 is controlled by the output of delay monitor circuit 11, and is represented by T. After capacitor 31 is charged, switch 56A is turned off, holding the potential of capacitor 31. After the completion of the charging of the capacitors 31, 32 ($t=T_4$), their potentials, i.e., potentials $V_{61}$, $V_{62}$ of nodes 61, 62 are expressed respectively by equations (4), (5) described above:

$$V_{61} = V_{DD} + \frac{I_{LEAK}T}{\alpha C_0}$$

$$V_{62} = V'_{DD} + \frac{I'_{LEAK}T'}{\alpha C_0}$$

Thereafter, in comparing circuit 40, the result of the comparison between potential $V_{61}$ and potential $V_{62}$ is read into the flip-flop. Then, comparing circuit 40 sends control signal UP/DOWN to power supply voltage providing circuit 3 for decreasing the power supply voltage if $V_{61}>V_{62}$ and increasing the power supply voltage if $V_{61}<V_{62}$.

As described above, by using the semiconductor integrated circuit device of the third exemplary embodiment, it is possible to control the power supply voltage delivered to target circuit 4 such that it is finally equalized to the power supply voltage for minimizing the consumed energy. Furthermore, inasmuch as the semiconductor integrated circuit device of the third exemplary embodiment requires only one leak monitor circuit and only one delay monitor circuit, the area overhead of the semiconductor integrated circuit device can be reduced. With the semiconductor integrated circuit device of the present exemplary embodiment, furthermore, since leak currents $I_{LEAK}$, $I_{LEAK}'$ at power supply voltage $V_{DD}$ and voltage $V_{DD}'$ are monitored by single leak monitor circuit 21, and critical path delays T, T' at power supply voltage $V_{DD}$ and voltage $V_{DD}'$ are monitored by single leak monitor circuit 11, a detection error due to variations of replicas can be reduced.

Fourth Exemplary Embodiment

Figure 16:
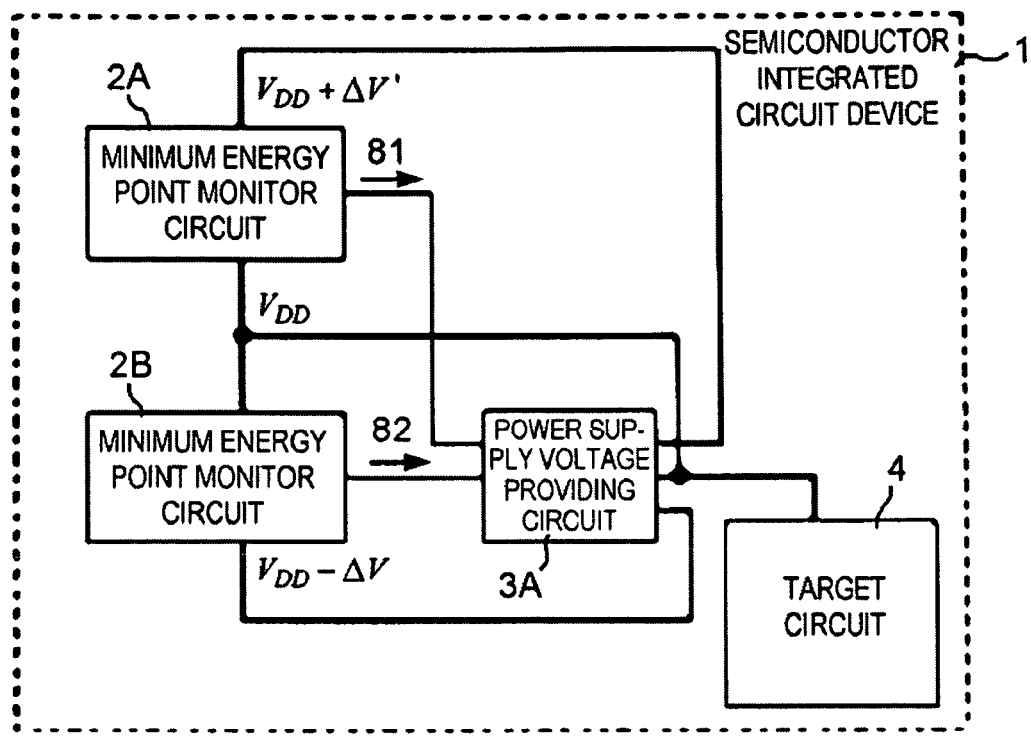
FIG. 16 is a block diagram showing the overall arrangement of a semiconductor integrated circuit device according to a fourth exemplary embodiment of the present invention.

FIG. 16 shows the arrangement of a semiconductor integrated circuit device according to a fourth exemplary embodiment of the present invention. This semiconductor integrated circuit device 1 includes: target circuit 4 realizing the primary functions of semiconductor integrated circuit device 1 and performing a process to be performed by semiconductor integrated circuit device 1; minimum energy point monitor circuits 2A, 2B which detect a power supply voltage at which the energy consumed by target circuit 4 is minimum; and power supply voltage providing circuit 3A for generating power providing voltage $V_{DD}$ to be delivered to target circuit 4. Target circuit 4 is a circuit whose power supply voltage is to be controlled. Power supply voltage providing circuit 3 also generates voltage $V_{DD}-\Delta V$ which is lower than power supply voltage $V_{DD}$ by $\Delta V$ and voltage $V_{DD}+\Delta V'$ which is higher than power supply voltage $V_{DD}$ by $\Delta V'$. Minimum energy point monitor circuits 2A, 2B delover control signals 81, 82 for increasing or decreasing power supply voltage $V_{DD}$ to power supply voltage providing circuit 3.

In the fourth exemplary embodiment, minimum energy point monitor circuits 2A, 2B have a circuit arrangement which is the same as that of minimum energy point monitor circuit 2 in the first exemplary embodiment shown in FIG. 3, but is different therefrom in that minimum energy point monitor circuit 2A is fed with power supply voltage $V_{DD}$ and voltage $V_{DD}+\Delta V'$ and minimum energy point monitor circuit 2B is fed with power supply voltage $V_{DD}$ and voltage $V_{DD}-\Delta V$.

Figure 17:
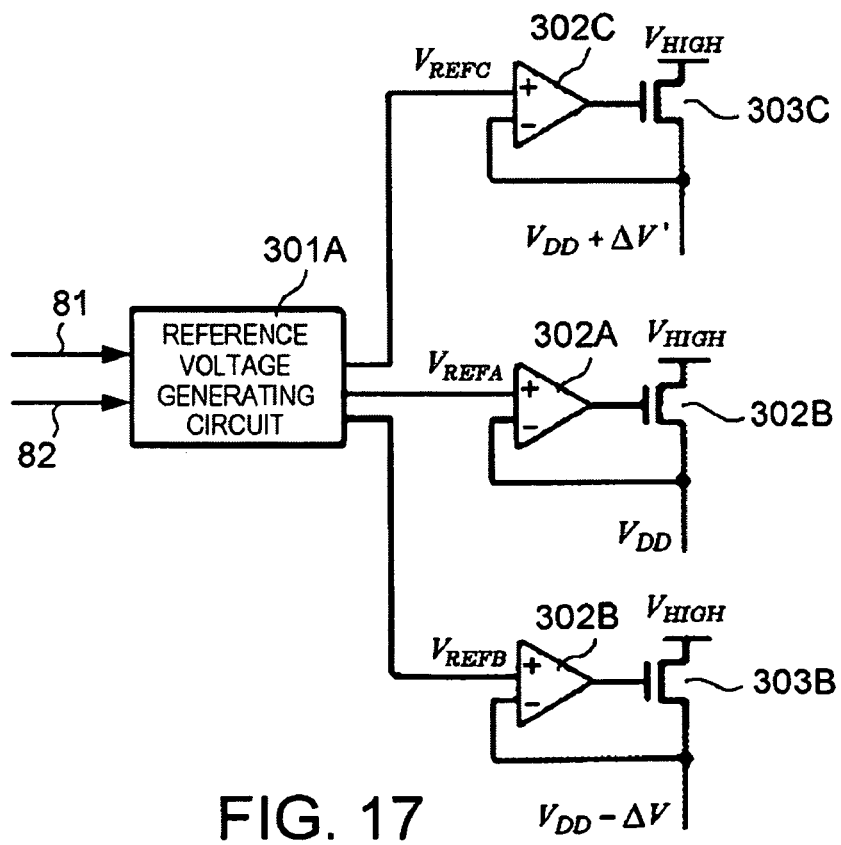
FIG. 17 is a circuit diagram showing the arrangement of a power supply voltage providing circuit in the fourth exemplary embodiment.

FIG. 17 shows the circuit arrangement of power supply voltage providing circuit 3A in the fourth exemplary embodiment. Power supply voltage providing circuit 3A includes: reference voltage generating circuit 301A; operational amplifiers 302A to 302C; and N-MOSFETs 303A to 303C. N-MOSFETs 303A to 303C have respective sources connected to power supply $V_{HIGH}$. Operational amplifiers 302A to 302C have respective non-inverting input terminals for being fed with outputs $V_{REFA}$, $V_{REFB}$, $V_{REFC}$ from reference voltage generating circuit 301A and respective inverting input terminals connected respectively to the drains of N-MOSFETs 303A to 303C. The outputs of operational amplifiers 302A to 302C are connected respectively to the gates of N-MOSFETs 303A to 303C. With this arrangement, N-MOSFETs 303A to 303C function as control elements of a series regulator, and the drains of N-MOSFETs 303A to 303C deliver respective potentials $V_{DD}$ (=$V_{REFA}$), $V_{DD}-\Delta V$ (=$V_{REFB}$), $V_{DD}+\Delta V'$ (=$V_{REFC}$) to the outside.

Reference voltage generating circuit 301A is basically the same as reference voltage generating circuit 301 in the first exemplary embodiment shown in FIG. 10, except that it has three output nodes for delivering three types of potentials $V_{REFA}$, $V_{REFB}$, $V_{REFC}$. For each of the three output nodes, (S−1) pieces of switches are inserted between nodes between adjacent ones of the resistors and the relevant output node. Here, it is assumed that $V_{REFB}=V_{REFA}-\Delta V$, $V_{REFC}=V_{REFA}+\Delta V'$, $\Delta V$ and $\Delta V'$ being of values sufficiently smaller than $V_{REFA}$. In this reference voltage generating circuit 301A also, one of the switches is turned on for each of the output nodes, and which one of the switches is to be turned on is controlled by outputs 81, 82 from minimum energy point monitor circuits 2A, 2B.

In the fourth exemplary embodiment, minimum energy point monitor circuit 2A is fed with voltages $V_{DD}+\Delta V'$, $V_{DD}$ from power supply voltage providing circuit 3A and minimum energy point monitor circuit 2A is fed with voltages $V_{DD}$, $V_{DD}-\Delta V$. If both minimum energy point monitor circuits 2A, 2B deliver control signals for decreasing the power supply voltage, then power supply voltage providing circuit 3A lowers the output voltage, and if both minimum energy point monitor circuits 2A, 2B deliver control signals for increasing the power supply voltage, then power supply voltage providing circuit 3A raises the output voltage. If minimum energy point monitor circuit 2A delivers a control signal for decreasing the power supply voltage while minimum energy point monitor circuit 2B delivers a control signal for increasing the power supply voltage, then power supply voltage providing circuit 3A maintains the output voltage.

As described above, by using the semiconductor integrated circuit device of the fourth exemplary embodiment, it is possible to control the power supply voltage delivered to target circuit 4 such that it is finally equalized to the power supply voltage for minimizing the consumed energy. According to the present exemplary embodiment, furthermore, since the power supply voltage can finally be maintained without being varied, the stability of the power supply voltage is improved.

Fifth Exemplary Embodiment

Figure 18:
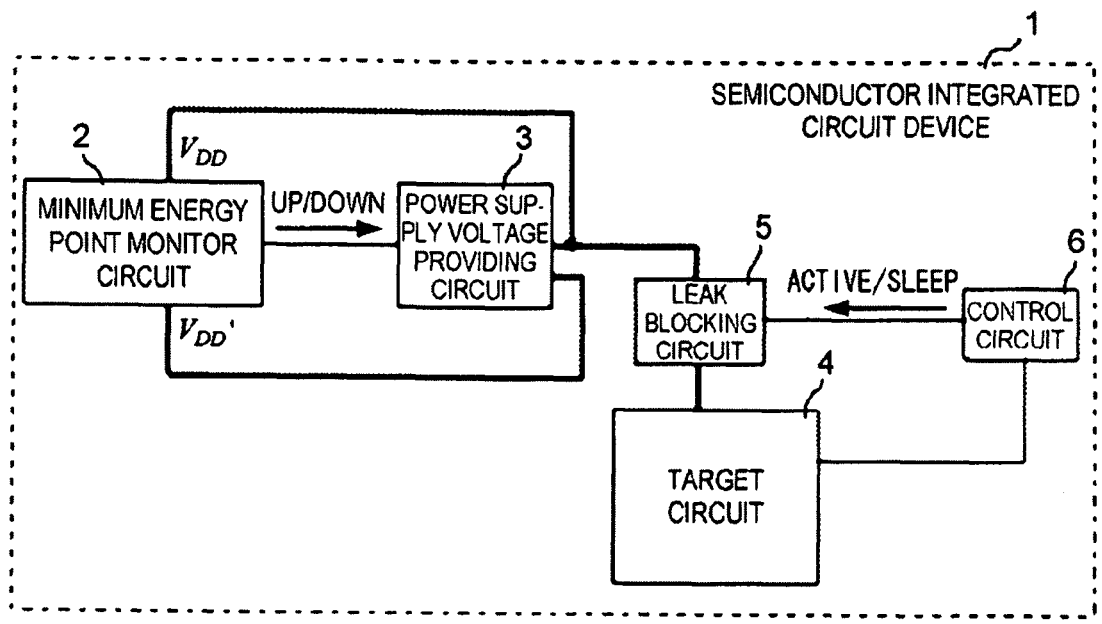
FIG. 18 is a block diagram showing the overall arrangement of a semiconductor integrated circuit device according to a fifth exemplary embodiment of the present invention.

FIG. 18 shows the arrangement of a semiconductor integrated circuit device according to a fifth exemplary embodiment of the present invention. Semiconductor integrated circuit device 1 of the fifth exemplary embodiment is similar to the semiconductor integrated circuit device of the first exemplary embodiment shown in FIG. 2, but is different therefrom in that it includes: leak blocking circuit 5 inserted between power supply voltage providing circuit 3 and target circuit 4; and control circuit 6 which detects an operating state of target circuit 4 to sends a control signal to leak blocking circuit 5. Minimum energy point monitor circuit 2 and power supply voltage providing circuit 3 are of circuit arrangements which are identical to those in the first exemplary embodiment. Control circuit 6 sends control signal ACTIVE to leak blocking circuit 5 when target circuit 4 starts operating, and sends control signal SLEEP to leak blocking circuit 5 when target circuit 4 stops operating.

Figure 19:
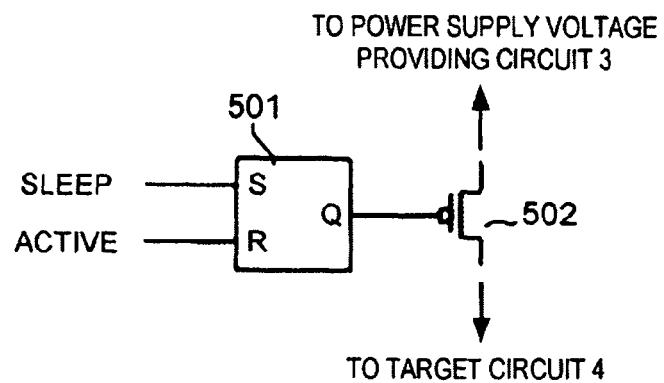
FIG. 19 is a circuit diagram showing the arrangement of a leak blocking circuit in the fifth exemplary embodiment.

FIG. 19 shows the circuit arrangement of leak blocking circuit 5. Leak blocking circuit 5 includes a power switch P-MOSFET (P-channel MOS field-effect transistor) 501 and RS (set-reset) flip-flop 502. RS flip-flop 502 has an R (reset) input terminal for being fed with control signal ACTIVE for controlling the timing to start operating target circuit 4 and an S (set) input terminal for being fed with control signal SLEEP for controlling the end of operation of target circuit 4. Output terminal Q of RS flip-flop 502 is connected to the gate of P-MOSFET 501.

With leak blocking circuit 5 thus arranged, when target circuit 4 is to operate, output terminal Q of RS flip-flop 502 becomes "0", turning on or rendering conductive P-MOSFET 501. Semiconductor integrated circuit device 1 now operates in the same manner as with the first exemplary embodiment. Thereafter, when target circuit 4 stops operating, control signal SLEEP is applied to the S input terminal of RS flip-flop 502, whose output terminal Q becomes "1", turning off or rendering nonconductive P-MOSFET 501 to block the leak current of target circuit 4.

As described above, by using the semiconductor integrated circuit device of the fifth exemplary embodiment, it is possible to minimize the consumed energy while target circuit 4 is in operation, and to reduce the consumed energy while target circuit 4 is not in operation. In the circuitry described above, leak blocking circuit 5 comprises a combination of an RS flip-flop and a P-MOSFET. However, leak blocking circuit 5 is not limited to such an arrangement, but may be of any desired circuit arrangement insofar as it applies power supply voltage $V_{DD}$ delivered from power supply voltage providing circuit 3 directly to target circuit 4 when target circuit 4 starts operating, and blocks the leak current when target circuit 4 stops operating. The semiconductor integrated circuit devices according to the second to fourth exemplary embodiments may also include a leak blocking circuit.

According to each of the above exemplary embodiments, the power supply voltage is controlled to minimize the consumed energy. Stated otherwise, the power supply voltage is controlled to minimize the product of the consumed power and the delay time. It is important to minimize the product of the consumed power and the delay time, and the consumed energy cannot be minimized simply by minimizing the consumed power or simply by setting the delay time to a particular value.

While the present invention has been described above with respect to the exemplary embodiments, the present invention is not limited to the above exemplary embodiments. Various changes that are obvious to those skilled in the art may be made to the arrangements and details of the present invention within the scope of the invention.

CITATION LIST

Patent literature 1: JP-A-2002-100967
Patent literature 2: JP-A-2003-142598
Patent literature 3: JP-A-2005-197411
Patent literature 4: WO99/12263
Patent literature 5: JP-A-2003-115750
Patent literature 6: JP-A-2005-340426
Non-patent literature 1: Seongsoo Lee and Takayasu Sakurai, "Run-time Voltage Hopping for Low-power Real-time Systems," Design Automation Conference, pp. 806-809, Jun. 5-9, 2000
Non-patent literature 2: David Blaauw and Bo Zhai, "Energy Efficient Design for Subthreshold Voltage Operation," IEEE International Symposium on Circuits and Systems, pp. 21-24, May 2006

What is claimed is:

1. A semiconductor integrated circuit device comprising:
a target circuit whose at least one power supply voltage is variable;
a power supply voltage providing circuit feeding said target circuit with a power supply voltage to said target circuit; and
a minimum energy point monitor circuit detecting an energy-minimizing power supply voltage which minimizes a change in energy consumed by said target circuit upon a change in the power supply voltage;
wherein the power supply voltage delivered by said power supply voltage providing circuit is controlled so as to be equal to said energy-minimizing power supply voltage detected by said minimum energy point monitor circuit.

2. The semiconductor integrated circuit device according to claim 1, wherein said power supply voltage providing circuit feeds said minimum energy point monitor circuit with a first power supply voltage and a second power supply voltage which is different from said first power supply voltage;
said minimum energy point monitor circuit comprises a delay monitor circuit monitoring a critical path delay of said target circuit, a leak monitor circuit monitoring a leak current of said target circuit, and a capacitor having a capacitance which is proportional to a switching capacitance of said target circuit;
said capacitor is charged at said first power supply voltage, and thereafter said capacitor is charged with the leak current of said target circuit at said first power supply voltage for a time corresponding to the critical path delay of said target circuit at said first power supply voltage, said capacitor having a first capacitor potential after being charged with the leak current;
said capacitor is charged at said second power supply voltage, and thereafter said capacitor is charged with the leak current of said target circuit at said second power supply voltage for a time corresponding to the critical path delay of said target circuit at said second power supply voltage, said capacitor having a second capacitor potential after being charged with the leak current; and
said minimum energy point monitor circuit compares said first capacitor potential and said second capacitor potential with each other, and detects said power supply voltage as said energy-minimizing power supply voltage when said first capacitor potential and said second capacitor potential coincide with each other.

3. The semiconductor integrated circuit device according to claim 1, wherein said power supply voltage providing circuit feeds said minimum energy point monitor circuit with a first power supply voltage and a second power supply voltage which is different from said first power supply voltage;
said minimum energy point monitor circuit comprises a first delay monitor circuit being fed with said first power supply voltage and monitoring a critical path delay of said target circuit at said first power supply voltage, a second delay monitor circuit being fed with said second power supply voltage and monitoring a critical path delay of said target circuit at said second power supply voltage, a first leak monitor circuit being fed with said first power supply voltage and monitoring a leak current of said target circuit at said first power supply voltage, a second leak monitor circuit being fed with said second power supply voltage and monitoring a leak current of said target circuit at said second power supply voltage, and a first capacitor and a second capacitor having capacitances which are proportional to a switching capacitance of said target circuit;
said first capacitor is charged at said first power supply voltage, and thereafter said first capacitor is charged with the leak current detected by said first leak monitor circuit for a time corresponding to the critical path delay detected by said first delay monitor circuit, said first capacitor having a first capacitor potential after being charged with the leak current;
said second capacitor is charged at said second power supply voltage, and thereafter said second capacitor is charged with the leak current detected by said second leak monitor circuit for a time corresponding to the critical path delay detected by said second delay monitor circuit, said second capacitor having a second capacitor potential after being charged with the leak current; and said minimum energy point monitor circuit compares said first capacitor potential and said second capacitor potential with each other, and detects said first power supply voltage as said energy-minimizing power supply voltage when said first capacitor potential and said second capacitor potential coincide with each other.

4. The semiconductor integrated circuit device according to claim 1, wherein said power supply voltage providing circuit feeds said minimum energy point monitor circuit with a first power supply voltage and a second power supply voltage which is different from said first power supply voltage;

said minimum energy point monitor circuit comprises a delay monitor circuit monitoring a critical path delay of said target circuit, a leak monitor circuit monitoring a leak current of said target circuit, and a capacitor having a capacitance which is proportional to a switching capacitance of said target circuit; and said minimum energy point monitor circuit charges said capacitor at said first power supply potential, thereafter said minimum energy point monitor circuit charges said capacitor with the leak current of said target circuit at said first power supply voltage for a time corresponding to the critical path delay of said target circuit at said first power supply voltage, and at the same time that or after said minimum energy point monitor circuit charges said capacitor the leak current, said minimum energy point monitor circuit compares, with said second power supply voltage, the potential of said capacitor after said capacitor is discharged by the leak current of said target circuit at said second power supply voltage for a time corresponding to the critical path delay of said target circuit at said second power supply voltage, and said minimum energy point monitor circuit detects said first power supply potential as said energy-minimizing power supply voltage when said first capacitor potential and said second power supply potential coincide with each other.

5. The semiconductor integrated circuit device according to claim 2, wherein said delay monitor circuit comprises a critical path replica of said target circuit, and the voltage delivered by said power supply voltage providing circuit is applied to said critical path replica.

6. The semiconductor integrated circuit device according to claim 2, wherein said leak monitor circuit comprises a leak current replica of said target circuit and a current copy circuit; and said current copy circuit delivers a current flowing through said leak current replica to outside when a power supply voltage externally delivered is applied to said leak current replica.

7. The semiconductor integrated circuit device according to claim 1, further comprising:

a leak blocking circuit blocking a leak current of said target circuit;

wherein said leak blocking circuit blocks the leak current of said target circuit after said target circuit stops operating.

8. The semiconductor integrated circuit device according to claim 3, wherein said delay monitor circuit comprises a critical path replica of said target circuit, and the voltage delivered by said power supply voltage providing circuit is applied to said critical path replica.

9. The semiconductor integrated circuit device according to claim 3, wherein said leak monitor circuit comprises a leak current replica of said target circuit and a current copy circuit; and said current copy circuit delivers a current flowing through said leak current replica to outside when a power supply voltage externally delivered is applied to said leak current replica.

10. The semiconductor integrated circuit device according to claim 4, wherein said delay monitor circuit comprises a critical path replica of said target circuit, and the voltage delivered by said power supply voltage providing circuit is applied to said critical path replica.

11. The semiconductor integrated circuit device according to claim 4, wherein said leak monitor circuit comprises a leak current replica of said target circuit and a current copy circuit; and said current copy circuit delivers a current flowing through said leak current replica to outside when a power supply voltage externally delivered is applied to said leak current replica.

12. A semiconductor integrated circuit device comprising:

a target circuit whose at least one power supply voltage is variable;

a power supply voltage providing circuit feeding said target circuit with a power supply voltage; and a minimum energy point monitor circuit determining whether a rate of change of energy consumed by said target circuit upon a change in the power supply voltage is positive or negative;

wherein the power supply voltage delivered by said power supply voltage providing circuit is controlled so as to be decreased if a value detected by said minimum energy point monitor circuit is positive, and increased if the value detected by said minimum energy point monitor circuit is negative.

13. The semiconductor integrated circuit device according to claim 12, wherein said power supply voltage providing circuit delivers a first power supply voltage which is equal to the power supply voltage of said target circuit and a second power supply voltage which is lower than said first power supply voltage;

said minimum energy point monitor circuit comprises a delay monitor circuit monitoring a critical path delay of said target circuit, a leak monitor circuit monitoring a leak current of said target circuit, and a capacitor having a capacitance which is proportional to a switching capacitance of said target circuit;

said capacitor is charged at said first power supply voltage, and thereafter said capacitor is charged with the leak current of said target circuit at said first power supply voltage for a time corresponding to the critical path delay of said target circuit at said first power supply voltage, said capacitor having a first capacitor potential after being charged with the leak current;

said capacitor is charged at said second power supply voltage, and thereafter said capacitor is charged with the leak current of said target circuit at said second power supply voltage for a time corresponding to the critical path delay of said target circuit at said second power supply voltage, said capacitor having a second capacitor potential after being charged with the leak current; and said minimum energy point monitor circuit compares said first capacitor potential and said second capacitor potential with each other, determines that said rate of change is positive if said first capacitor potential is higher than said second capacitor potential, and determines that said rate of change is negative if said first capacitor potential is lower than said second capacitor potential.

14. A semiconductor integrated circuit device comprising:
a target circuit whose at least one power supply voltage is variable;
a power supply voltage providing circuit feeding said target circuit with a power supply voltage; and
a first minimum energy point monitor circuit and a second minimum energy point monitor circuit for detecting whether a rate of change of energy consumed by said target circuit upon a change in the power supply voltage is positive or negative;
wherein said first minimum energy point monitor circuit determines said rate of change at a first power supply voltage, and said second minimum energy point monitor circuit determines said rate of change at a second power supply voltage which is higher than said first power supply voltage; and
said power supply voltage providing circuit feeds said target circuit with a voltage which is equal to said first power supply voltage when a result determined by said first minimum energy point monitor circuit is negative and a result determined by said second minimum energy point monitor circuit is positive.

15. A power supply voltage control system for a target circuit whose at least one power supply voltage is variable, comprising:
power supply voltage providing means for feeding said target with a power supply voltage to said target circuit; and
minimum energy point monitor means for detecting an energy-minimizing power supply voltage which minimizes a change in energy consumed by said target circuit upon a change in the power supply voltage;
wherein said power supply voltage providing means is controlled so as to equalize the power supply voltage delivered by said power supply voltage providing means to said energy-minimizing power supply voltage.

16. A power supply voltage control system for a target circuit whose at least one power supply voltage is variable, comprising:
power supply voltage providing means for feeding said target circuit with a power supply voltage to; and
minimum energy point monitor means for determining whether a rate of change of energy consumed by said target circuit upon a change in the power supply voltage is positive or negative;
wherein the power supply voltage delivered by said power supply voltage providing means is controlled so as to be decreased if said rate of change is positive, and increased if said rate of change is negative.

* * * * *